(12) United States Patent
Wu

(10) Patent No.: US 12,272,302 B2
(45) Date of Patent: Apr. 8, 2025

(54) DISPLAY, DISPLAY FABRICATION METHOD, AND ELECTRONIC DEVICE

(71) Applicant: VIVO MOBILE COMMUNICATION CO., LTD., Dongguan (CN)

(72) Inventor: Wen Wu, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 0 days.

(21) Appl. No.: 18/226,820

(22) Filed: Jul. 27, 2023

(65) Prior Publication Data

US 2023/0368729 A1 Nov. 16, 2023

Related U.S. Application Data

(63) Continuation of application No. PCT/CN2022/073795, filed on Jan. 25, 2022.

(30) Foreign Application Priority Data

Jan. 28, 2021 (CN) .......................... 202110117121.4

(51) Int. Cl.
*G09G 3/3208* (2016.01)
*G06V 40/13* (2022.01)
*H10K 39/34* (2023.01)
*H10K 50/11* (2023.01)
*H10K 50/14* (2023.01)
*H10K 59/65* (2023.01)

(52) U.S. Cl.
CPC .......... *G09G 3/3208* (2013.01); *H10K 50/11* (2023.02); *H10K 50/14* (2023.02); *G06V 40/1318* (2022.01); *H10K 39/34* (2023.02); *H10K 59/65* (2023.02)

(58) Field of Classification Search
CPC ...... G09G 3/3208; H10K 50/11; H10K 50/14; H10K 59/65; H10K 39/34; G06V 40/1318
USPC ........................................................... 345/76
See application file for complete search history.

(56) References Cited

U.S. PATENT DOCUMENTS

2018/0067212 A1     3/2018  Wilson et al.
2021/0036047 A1*    2/2021  Heo ................. H01L 27/14652

FOREIGN PATENT DOCUMENTS

CN      107316885 A     11/2017
CN      109091153 A     12/2018
CN      109920832 A     6/2019
(Continued)

OTHER PUBLICATIONS

International Search Report issued in corresponding International Application No. PCT/CN2022/073795, mailed April 1. 2022, 7 pages.
(Continued)

*Primary Examiner* — Jimmy H Nguyen
(74) *Attorney, Agent, or Firm* — IPX PLLC

(57) ABSTRACT

A display, a display fabrication method, and an electronic device are provided. The display includes a light-emitting layer. The light-emitting layer includes a fingerprint display region. The fingerprint display region includes a first visible light-emitting unit and an infrared light-emitting unit. The first visible light-emitting unit is superposed on the infrared light-emitting unit. The first visible light-emitting unit is disposed on a side, close to a display surface of the display, of the infrared light-emitting unit.

14 Claims, 5 Drawing Sheets

(56) References Cited

FOREIGN PATENT DOCUMENTS

| CN | 208985184 U | 6/2019 | |
|---|---|---|---|
| CN | 110187537 A | 8/2019 | |
| CN | 110909576 A | 3/2020 | |
| CN | 112885883 A | 6/2021 | |
| WO | WO-2019146995 A1 * | 8/2019 | ........... G06F 3/0412 |
| WO | 2020128735 A1 | 6/2020 | |

OTHER PUBLICATIONS

First Office Action issued in corresponding CN Patent Application No. 202110117121.4, dated Apr. 6, 2022, 7 pages.
Decision of Rejection issued in corresponding CN Patent Application No. 202110117121.4, dated Oct. 31, 2022, 4 pages.

* cited by examiner

DISPLAY, DISPLAY FABRICATION METHOD, AND ELECTRONIC DEVICE

CROSS-REFERENCE TO RELATED APPLICATIONS

This application is a continuation of International Application No. PCT/CN2022/073795, filed on Jan. 25, 2022, which claims priority to Chinese Patent Application No. 202110117121.4, filed on Jan. 28, 2021. The entire contents of each of the above-referenced applications are expressly incorporated herein by reference.

TECHNICAL FIELD

This application belongs to the technical field of display devices, and specifically relates to a display, a display fabrication method, and an electronic device.

BACKGROUND

With the development of full screens, under-screen fingerprint modules are increasingly widely used in electronic devices.

An existing under-screen fingerprint module mainly uses a photoelectric fingerprint technology, in which fingerprint-based unlocking is implemented mainly by using a photoelectric conversion principle. For example, visible light emitted by a display reaches a finger. After being reflected by the finger, part of the visible light passes through the display and reaches an under-screen fingerprint module. An optical sensor in the under-screen fingerprint module receives the reflected light passing through the display, and converts the reflected light into an electrical signal, thereby implementing collection of fingerprint information. Because visible light has low penetrability, a requirement for light transmittance of a display is high when visible light is used as a carrier of fingerprint information. However, to ensure display performance of a display, light transmittance of the display should not be increased infinitely. As a result, performance of a fingerprint module is poor due to limitation by the light transmittance of the display.

Penetrability of infrared light is better than that of visible light. However, an infrared transmitter and an optical sensor need to be disposed under a screen when infrared light is used. As a result, large space under the screen is occupied.

SUMMARY

Embodiments of this application aim to provide a display. This application is implemented as follows.

A display is provided, including a light-emitting layer. The light-emitting layer includes a fingerprint display region.

The fingerprint display region includes a first visible light-emitting unit and an infrared light-emitting unit. The first visible light-emitting unit is superposed on the infrared light-emitting unit. The first visible light-emitting unit is disposed on a side, close to a display surface of the display, of the infrared light-emitting unit.

A display fabrication method is provided, including:
preparing a base layer;
preparing an infrared light-emitting unit in a region, corresponding to the infrared light-emitting unit, of the base layer via an evaporation process; and
preparing a first visible light-emitting unit on the infrared light-emitting unit via the evaporation process, and preparing a second visible light-emitting unit on the base layer via the evaporation process.

An electronic device is provided, including the foregoing display.

In the display disclosed in the embodiments of the present application, the infrared light-emitting unit is superposed on the first visible light-emitting unit, so that normal display can be implemented in the fingerprint display region, and the infrared light-emitting unit can emit infrared light that is used as a carrier of fingerprint sensing information. In a case that light transmittance of the display is fixed, transmittance of infrared light is greater than transmittance of visible light, so that collection accuracy of fingerprint information can be improved. This further improves performance of a fingerprint module of the electronic device. In addition, according to this application, the infrared light-emitting unit is embedded in the light-emitting layer of the display, so that occupying, by an infrared transmitter, of space under the display of the electronic device can be avoided.

DETAILED DESCRIPTION

Figure 1:
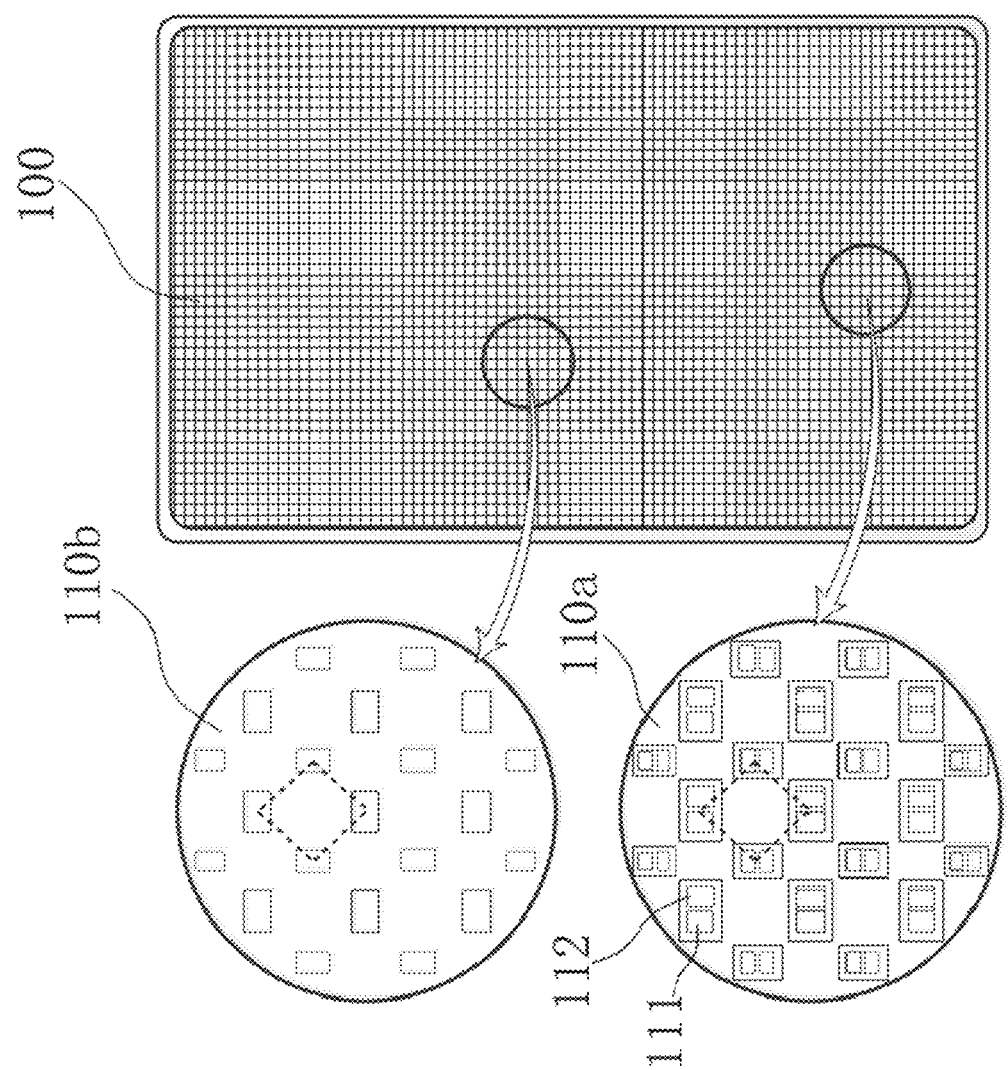
FIG. 1 is an enlarged schematic diagram of a fingerprint display region and a non-fingerprint display region of a display according to an embodiment of the present application.

The following clearly describes the technical solutions in the embodiments of this application with reference to the accompanying drawings in the embodiments of this application. Apparently, the described embodiments are some rather than all of the embodiments of this application. Based on the embodiments of this application, all other embodiments obtained by a person of ordinary skill in the art without creative efforts fall within the protection scope of this application.

Terms "first", "second", and the like in the specification and the claims of this application are used to distinguish between similar objects, instead of describing a specific sequence or order. It should be understood that, data used in such a way is interchangeable in proper circumstances, so that the embodiments of this application can be implemented in an order other than the order illustrated or described herein. Objects classified by "first", "second", and the like are usually of a same type, and the quantity of objects is not limited. For example, there may be one or more first objects. In addition, in the specification and the claims, "and/or" represents at least one of connected objects, and a character "/" generally represents an "or" relationship between associated objects.

With reference to FIG. 1 to FIG. 5, a display provided in the embodiments of this application is described below in detail by using embodiments and application scenarios thereof.

With reference to FIG. 1 to FIG. 4, the display 100 disclosed in the embodiments of this application includes a light-emitting layer 110. The light-emitting layer 110 includes a fingerprint display region 110a. The fingerprint display region 110a is configured to collect fingerprint information. The fingerprint display region 110a includes a first visible light-emitting unit 111 and an infrared light-emitting unit 112. The first visible light-emitting unit 111 is superposed on the infrared light-emitting unit 112. The first visible light-emitting unit 111 is disposed on a side, close to a display surface of the display 100, of the infrared light-emitting unit 112. There are a plurality of first visible light-emitting units 111 that are distributed in an array. There are also a plurality of infrared light-emitting units 112 that are distributed in an array.

In this embodiment, the fingerprint display region 110a emits visible light through the first visible light-emitting unit 111, to meet a requirement for an image display function. The fingerprint display region 110a emits infrared light through the infrared light-emitting unit 112, to collect a fingerprint.

The first visible light-emitting unit 111 and the infrared light-emitting unit 112 are superposed, so that the infrared light-emitting unit 112 is prevented from occupying space between two adjacent first visible light-emitting units 111. This helps reduce the space between the two adjacent first visible light-emitting units 111, thereby improving display performance of the display. The infrared light-emitting unit 112 is integrated in the display 100. This can not only prevent infrared light emitted by the infrared light-emitting unit 112 from being blocked when being transmitted out of the display 100, to improve performance of the infrared light-emitting unit 112, but also prevent the infrared light-emitting unit 112 from occupying space under the display region of the display, to save internal space of a device.

It should be noted that, when an infrared transmitter is disposed under the display 100, during collection of fingerprint information, part of infrared light emitted by the infrared transmitter is blocked by the display 100 during transmission from the infrared transmitter to a finger. As a result, the infrared light is weakened. When the infrared light is reflected by the finger, the display 100 further blocks part of reflected infrared light during transmission of the light from the finger to an optical sensor. As a result, the infrared light is further weakened, and performance of a fingerprint module is reduced. According to the present application, the infrared light-emitting unit 112 is embedded in the light-emitting layer 110, so that a quantity of layers through which infrared light passes the display 100 can be reduced. Therefore, an amount of infrared light blocked in a transmission process is reduced, and performance of a fingerprint module is improved.

Figure 3:
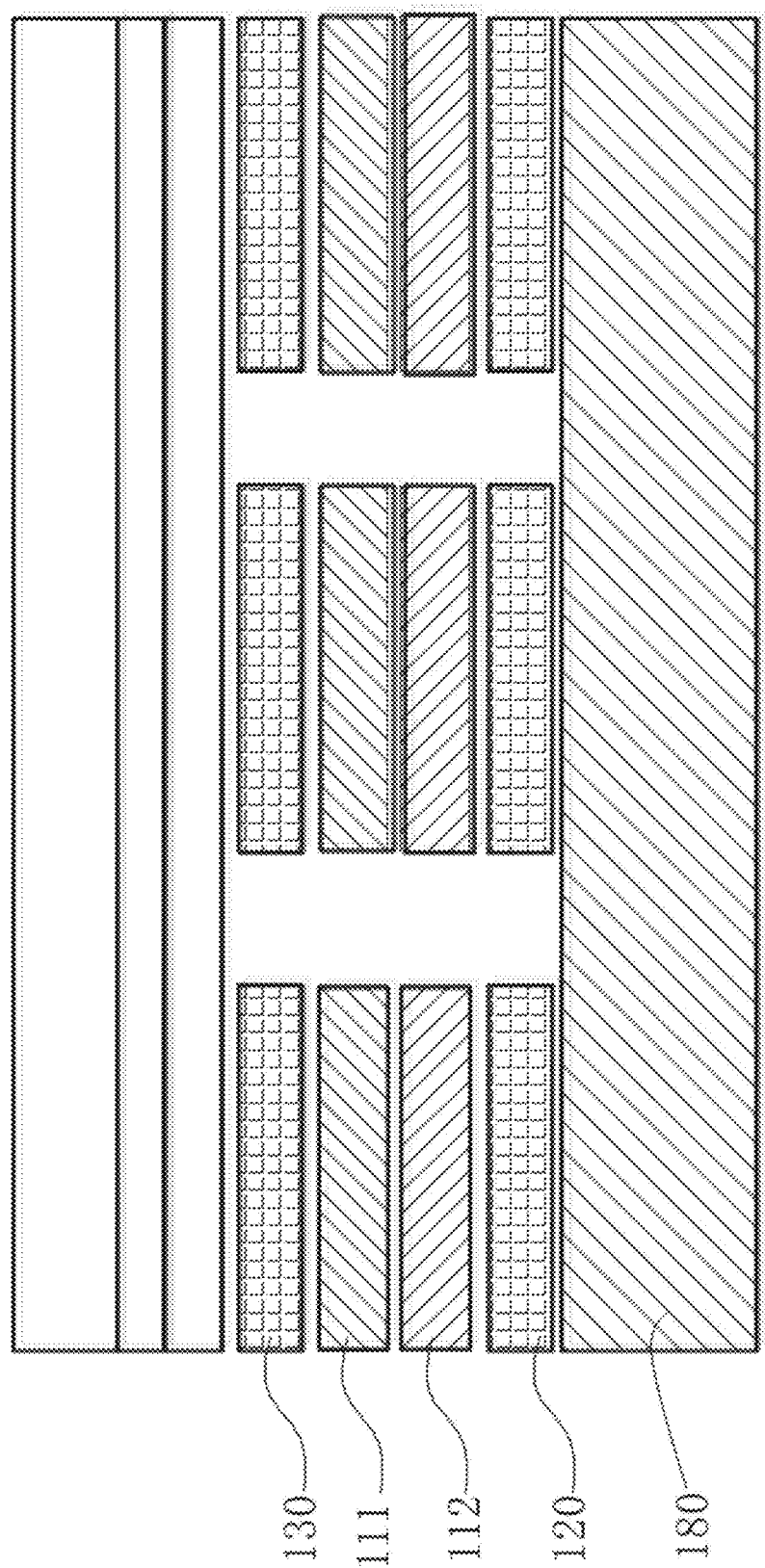
FIG. 3 is a sectional view of a fingerprint display region according to an embodiment of the present application.

With reference to FIG. 1 and FIG. 3, in the fingerprint display region 110a, the infrared light-emitting units 112 and the first visible light-emitting units 111 are in a one-to-one correspondence with each other, so that space between two adjacent infrared light-emitting units 112 can be reduced. Further, luminous flux of infrared light per unit area is increased, illumination intensity of infrared light is increased, and overall performance of a combination of the infrared light-emitting units 112 in the fingerprint display region 110a is improved.

Figure 2:
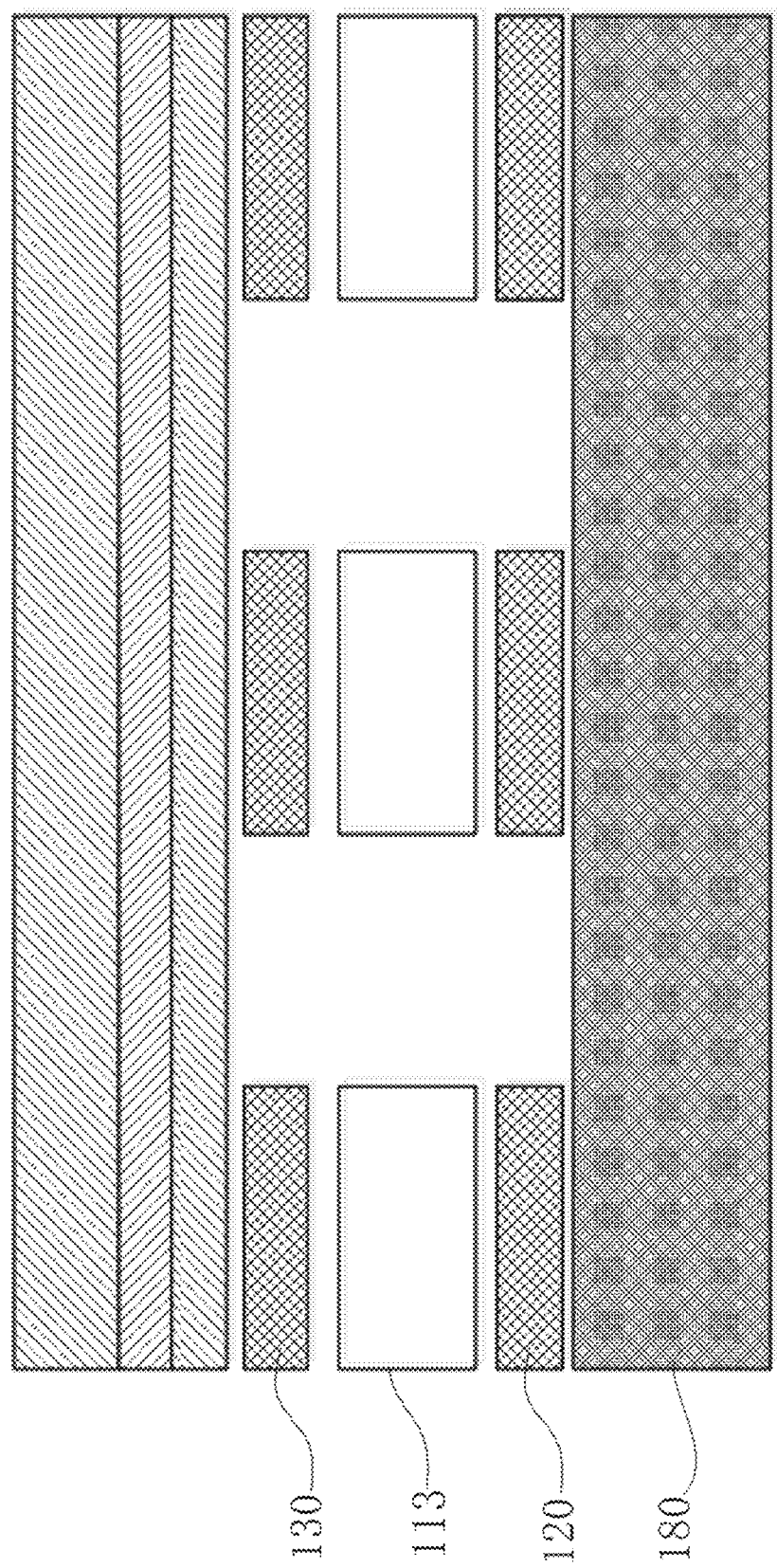
FIG. 2 is a sectional view of a non-fingerprint display region according to an embodiment of the present application.

With reference to FIG. 1 and FIG. 2, the light-emitting layer 110 further includes a non-fingerprint display region 110b. The non-fingerprint display region 110b includes a plurality of second visible light-emitting units 113. For example, the second visible light-emitting units 113 in the non-fingerprint display region 110b and the first visible light-emitting units 111 in the fingerprint display region 110a constitute a complete visible light display region of the display, thereby ensuring that each region of the display 100 can perform normal display. In addition, the infrared light-emitting units 112 and the first visible light-emitting units 111 are superposed in the fingerprint display region 110a, so that arrangement and density of the first visible light-emitting units 111 in the fingerprint display region 110a are the same as arrangement and density of the second visible light-emitting units 113 in the non-fingerprint display region 110b. Therefore, it is ensured that the non-fingerprint display region 110b has the same display performance as the fingerprint display region 110a.

The first visible light-emitting unit 111 includes an R pixel, a G pixel, and a B pixel. The infrared light-emitting unit 112 has an Infrared (IR) pixel. For example, in the fingerprint display region 110a, the IR pixel is superposed on a side, away from the display surface of the display 100, of the R pixel, the G pixel, and/or the B pixel. Because the IR pixel is superposed on the R pixel, the G pixel, and/or the B pixel, arrangement and density of the R pixels, the G pixels, and the B pixels in the fingerprint display region 110a are the same as arrangement and density of the R pixels, the G pixels, and the B pixels in the non-fingerprint display region 110b. Therefore, it is ensured that the fingerprint display region 110a has the same display performance as the non-fingerprint display region 110b.

The display 100 is an Organic Light-Emitting Diode (OLED) display. In some embodiments, the first visible light-emitting unit 111 and the second visible light-emitting unit 113 are made of different materials. For example, the first visible light-emitting unit 111 and the second visible light-emitting unit 113 are made of organic visible light-emitting materials. The infrared light-emitting unit 112 is made of an organic infrared light-emitting material. In some embodiments, the infrared light-emitting unit 112 is made of an NZ2TPA material. A wavelength of infrared light emitted by the NZ2TPA material ranges from 780 nm to 1100 nm, and a turn-on voltage of the NZ2TPA material is lower than a turn-on voltage of the organic visible light-emitting material, so that the first visible light-emitting unit 111, the second visible light-emitting unit 113, and/or infrared light-emitting unit 112 can be turned on and turned off by adjusting an input voltage. For example, it can be ensured, by lowering the voltage, that only the infrared light-emitting unit 112 is turned on in the light-emitting layer 110. In addition, light-emitting quantum efficiency of the NZ2TPA material is 60% in a pure film state, which is the highest value of light-emitting quantum efficiency of existing organic near-infrared emitting small molecules. When the NZ2TPA material is used as an infrared light-emitting material of a non-doped infrared OLED device, maximum external quantum efficiency of the infrared light-emitting unit 112 reaches 3.9%, which is the highest value of external quantum efficiency of existing non-doped infrared OLED devices that are based on organic small molecules. More importantly, an efficiency droop speed of the NZ2TPA material is very slow, and the external quantum efficiency of the infrared light-emitting unit 112 is still as high as 2.8% when luminance is 1000 cd/m$^2$.

In an embodiment of the present application, the display 100 further includes a control unit and a first circuit. A cathode terminal of the first circuit is connected to the infrared light-emitting unit 112. An anode terminal of the first circuit is connected to the first visible light-emitting unit 111. The control unit is connected to the first circuit. The control unit controls, by adjusting a voltage of the first circuit, the first visible light-emitting unit 111 or the infrared light-emitting unit 112 to be turned on or turned off. The first visible light-emitting unit 111 and the infrared light-emitting unit 112 are made of different materials, so that turn-on voltages of the first visible light-emitting unit 111 and the infrared light-emitting unit 112 are different. In some embodiments, the first circuit is a pixel display circuit. In some embodiments, the control unit may be a chip. Further, the chip is an internal chip of an electronic device. In some alternative embodiments, the control unit may be a circuit. The voltage of the first circuit is adjusted by changing a value of a connected resistor. The control unit has a plurality of types and forms. A specific type and form of the control unit are not limited in this application.

In a case that the turn-on voltage of the infrared light-emitting unit 112 is lower than the turn-on voltage of the first visible light-emitting unit 111, if voltages of the cathode terminal and the anode terminal of the first circuit are higher than or equal to the turn-on voltage of the infrared light-emitting unit 112, and voltages of the cathode terminal and the anode terminal of the first circuit are lower than the turn-on voltage of the first visible light-emitting unit 111, the infrared light-emitting unit 112 is turned on, and the first visible light-emitting unit 111 is turned off. For example, the display 100 is in a dormant state, and the infrared light-emitting unit 112 is turned on. In this case, fingerprint information can be collected through the fingerprint display region 110a.

If the voltages of the cathode terminal and the anode terminal of the first circuit are higher than the turn-on voltages of the infrared light-emitting unit 112 and the first visible light-emitting unit 111, both the infrared light-emitting unit 112 and the first visible light-emitting unit 111 are turned on. For example, the display 100 is woken up. In this case, the first visible light-emitting unit 111 can be used for implementing image display, and the fingerprint display region 110a can be used for implementing password-based unlocking, password-based payment, and the like.

Further, the cathode terminal of the first circuit is connected to a side, away from the display surface of the display 100, of the second visible light-emitting unit 113; the anode terminal of the first circuit is connected to a side, close to the display surface of the display 100, of the second visible light-emitting unit 113; and the first circuit supplies power to the second visible light-emitting unit 113. In the present application, due to a manner in which the control unit controls the voltage of the first circuit, the first visible light-emitting unit 111, the infrared light-emitting unit 112, and the second visible light-emitting unit 113 can share a same circuit. Therefore, a structure of the display 100 is simplified.

In another embodiment, the display 100 further includes a second circuit. A cathode terminal of the second circuit is connected to the side, away from the display surface of the display 100, of the second visible light-emitting unit 113; and an anode terminal of the second circuit is connected to the side, close to the display surface of the display 100, of the second visible light-emitting unit 113. In some embodiments, both the second circuit and the first circuit are connected to the control unit, so that working states of the first circuit and the second circuit are controlled by using the control unit. In some embodiments, the first circuit and/or the second circuit in this application are/is Thin Film Transistor (TFT) circuits/a thin film transistor circuit.

Figure 4:
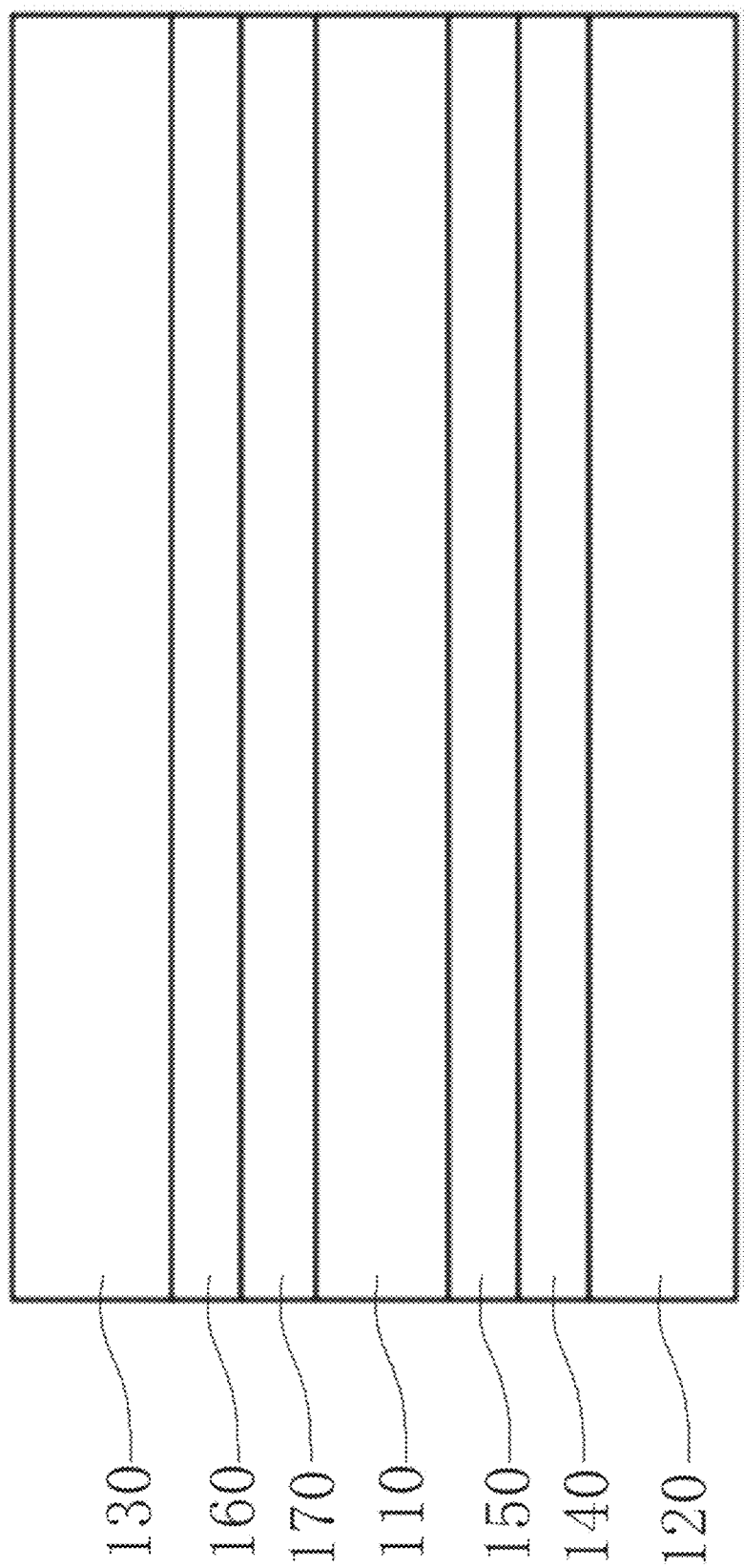
FIG. 4 is a schematic diagram of a partial structure of a display according to an embodiment of the present application.

With reference to FIG. 2 to FIG. 4, the display 100 may further include a cathode layer 120 and an anode layer 130. The light-emitting layer 110 is disposed between the cathode layer 120 and the anode layer 130. The cathode terminal of the first circuit is disposed on the cathode layer. The anode terminal of the first circuit is disposed on the anode layer. In this embodiment, the fingerprint display region 110a and the non-fingerprint display region 110b share the anode layer 130 and the cathode layer 120. Therefore, in a case that the infrared light-emitting unit 112 is added, the structure of the display 100 is simplified, and an increase, caused by the infrared light-emitting unit 112, in a thickness of the display 100 is avoided. In addition, fabrication difficulty of the display 100 is decreased.

With reference to FIG. 4, the display 100 further includes an electron injection layer 140 and an electron transport layer 150. The electron injection layer 140 and the electron transport layer 150 are disposed between the cathode layer 120 and the light-emitting layer 110. The electron injection layer 140 is superposed on the electron transport layer 150. The electron injection layer 140 faces the cathode layer 120. The electron transport layer 150 faces the light-emitting layer 110. The cathode terminal of the first circuit injects an electron to the light-emitting layer 110 through the electron injection layer 140 and the electron transport layer 150. The infrared light-emitting unit 112, the first visible light-emitting unit 111, and the second visible light-emitting unit 113 share the electron injection layer 140 and the electron transport layer 150, thereby decreasing the thickness of the display 100, lowering the fabrication difficulty of the display 100, and facilitating fabrication of the display 100.

With reference to FIG. 4, the display 100 further includes a hole injection layer 160 and a hole transport layer 170. The hole injection layer 160 and the hole transport layer 170 are disposed between the anode layer 130 and the light-emitting layer 110. The hole injection layer 160 is superposed on the hole transport layer 170. The hole injection layer 160 faces the anode layer 130. The hole transport layer 170 faces the light-emitting layer 110. The anode terminal of the first circuit injects an electron hole to the light-emitting layer 110 through the hole injection layer 160 and the hole transport layer 170. The infrared light-emitting unit 112, the first visible light-emitting unit 111, and the second visible light-emitting unit 113 share the hole injection layer 160 and the hole transport layer 170, thereby decreasing the thickness of the display 100, lowering the fabrication difficulty of the display 100, and facilitating fabrication of the display 100.

Based on the display 100 provided in the present application, the present application further provides a display fabrication method. The display fabrication method is suitable for fabricating the display 100 described in this application. For example, the display 100 includes a base layer 180. The base layer 180 is disposed on a side, away from the light-emitting layer 110, of the cathode layer 120.

The fabrication method includes the following steps:

Step 101: Prepare the base layer 180.

Step 102: Prepare the infrared light-emitting unit 112 in a region, corresponding to the infrared light-emitting unit 112, of the base layer 180 via an evaporation process.

Step 103: Prepare the first visible light-emitting unit 111 on the infrared light-emitting unit 112 via the evaporation process, and prepare the second visible light-emitting unit 113 on the base layer 180 via the evaporation process.

In step 101, the preparing the base layer includes the following step:

Step 1011: Prepare the first circuit on the base layer via an etching process.

The first circuit is configured to supply power to the first visible light-emitting unit 111, the infrared light-emitting unit, and/or the second visible light-emitting unit 113.

Figure 5:
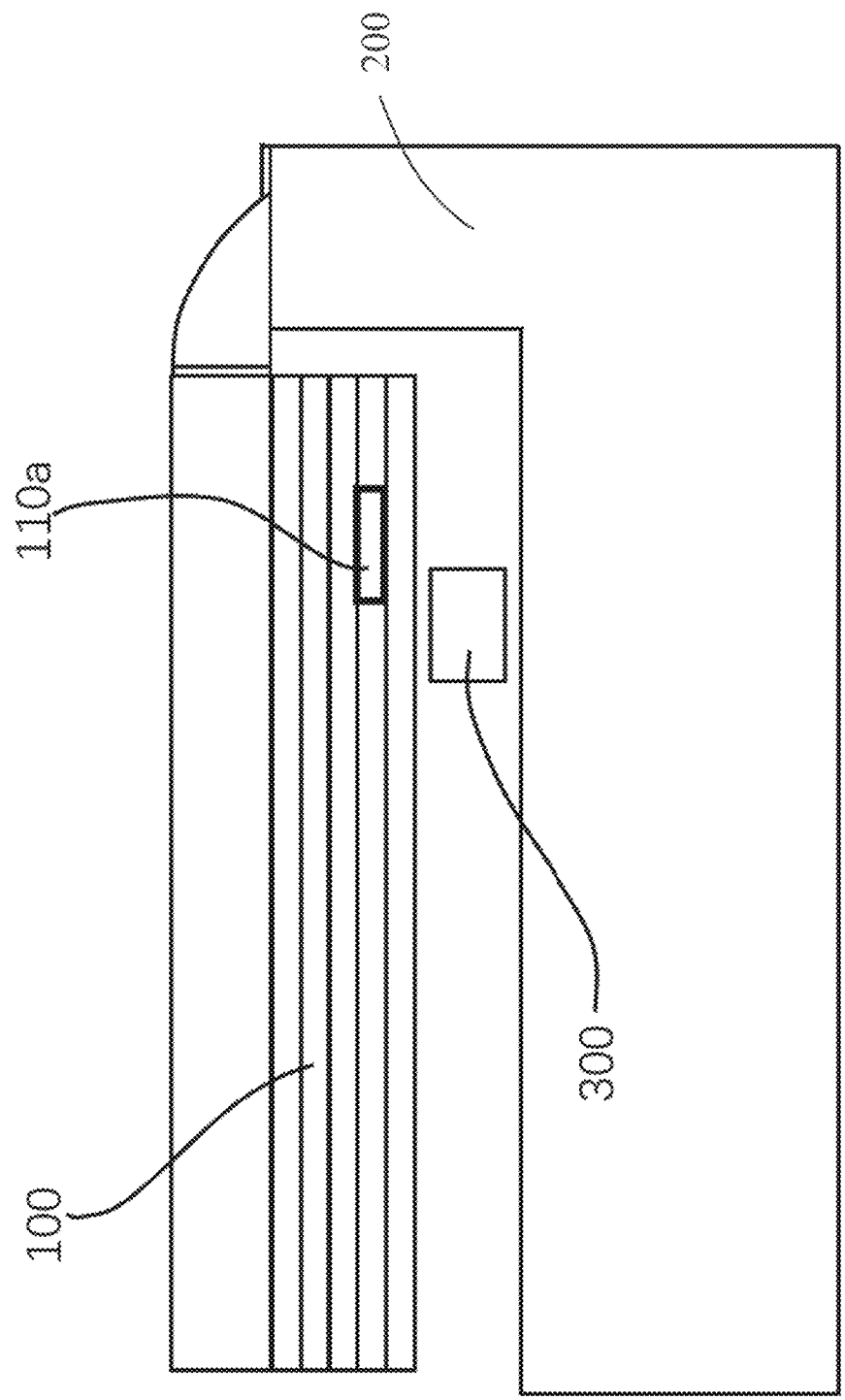
FIG. 5 is a schematic diagram of an electronic device according to an embodiment of the present application.

Based on the display provided in the present application, the present application further provides an electronic device. The electronic device includes the display 100 described above. With reference to FIG. 5, the electronic device further includes a device housing 200 and an optical sensor 300. The display is disposed on the device housing 200. Mounting space is formed between the display 100 and the device housing 200. The optical sensor 300 is disposed in the mounting space.

The electronic device disclosed in the embodiments of this application may be a mobile phone, a tablet computer, an ebook reader, a medical instrument, and the like. The embodiments of this application do not limit a specific type of the electronic device.

It should be noted that, in this specification, the terms "include", "comprise", or their any other variant is intended to cover a non-exclusive inclusion, so that a process, a method, an article, or an apparatus that includes a list of elements not only includes those elements but also includes other elements which are not expressly listed, or further includes elements inherent to such process, method, article, or apparatus. An element limited by "includes a . . . " does not, without more constraints, preclude the presence of additional identical elements in the process, method, article, or apparatus that includes the element. In addition, it should be noted that the scope of the method and the apparatus in the embodiments of this application is not limited to performing functions in an illustrated or discussed sequence, and may further include performing functions in a basically simultaneous manner or in a reverse sequence according to the functions concerned. For example, the described method may be performed in an order different from that described, and the steps may be added, omitted, or combined. In addition, features described with reference to some examples may be combined in other examples.

The embodiments of this application are described above with reference to the accompanying drawings. However, this application is not limited to the foregoing implementations. The foregoing implementations are merely illustrative instead of restrictive. Under the enlightenment of this application, a person of ordinary skill in the art may make many forms without departing from the essence of this application and the protection scope of claims, all of which fall within the protection of this application.

What is claimed is:

1. A display, comprising a light-emitting layer, wherein:
   the light-emitting layer comprises a fingerprint display region,
   the fingerprint display region comprises a first visible light-emitting unit and an infrared light-emitting unit, wherein a turn-on voltage of the infrared light-emitting unit is lower than a turn-on voltage of the first visible light-emitting unit, so that when an input voltage to the first visible light-emitting unit and the infrared light-emitting unit is higher than or equal to the turn-on voltage of the infrared light-emitting unit but is lower than the turn-on voltage of the first visible light-emitting unit, the infrared light-emitting unit is turned on and the first visible light-emitting unit is turned off,
   the first visible light-emitting unit is superposed on the infrared light-emitting unit, and
   the first visible light-emitting unit is disposed on a side, close to a display surface of the display, of the infrared light-emitting unit.

2. The display according to claim 1, wherein in the fingerprint display region, the infrared light-emitting unit and the first visible light-emitting unit are in a one-to-one correspondence with each other.

3. The display according to claim 1, wherein the light-emitting layer further comprises a non-fingerprint display region, and the non-fingerprint display region comprises a plurality of second visible light-emitting units.

4. The display according to claim 3, further comprising: a cathode layer and an anode layer, wherein:
   the light-emitting layer is disposed between the cathode layer and the anode layer.

5. The display according to claim 4, further comprising: an electron injection layer and an electron transport layer, wherein:
   the electron injection layer and the electron transport layer are disposed between the cathode layer and the light-emitting layer,
   the electron injection layer is superposed on the electron transport layer, the electron injection layer faces the cathode layer, and the electron transport layer faces the light-emitting layer.

6. The display according to claim 4, further comprising: a hole injection layer and a hole transport layer, wherein:
   the hole injection layer and the hole transport layer are disposed between the anode layer and the light-emitting layer,
   the hole injection layer is superposed on the hole transport layer, the hole injection layer faces the anode layer, and the hole transport layer faces the light-emitting layer.

7. The display according to claim 1, wherein the infrared light-emitting unit is made of an NZ2TPA material.

8. The display according to claim 7, wherein the infrared light-emitting unit has a wavelength between 780 nm and 1100 nm.

9. An electronic device, comprising a display comprising:
   a light-emitting layer,
   wherein:
   the light-emitting layer comprises a fingerprint display region,
   the fingerprint display region comprises a first visible light-emitting unit and an infrared light-emitting unit, wherein a turn-on voltage of the infrared light-emitting unit is lower than a turn-on voltage of the first visible light-emitting unit, so that when an input voltage to the first visible light-emitting unit and the infrared light-emitting unit is higher than or equal to the turn-on voltage of the infrared light-emitting unit but is lower than the turn-on voltage of the first visible light-emitting unit, the infrared light-emitting unit is turned on and the first visible light-emitting unit is turned off,
   the first visible light-emitting unit is superposed on the infrared light-emitting unit, and
   the first visible light-emitting unit is disposed on a side, close to a display surface of the display, of the infrared light-emitting unit.

10. The electronic device according to claim 9, wherein in the fingerprint display region, the infrared light-emitting unit and the first visible light-emitting unit are in a one-to-one correspondence with each other.

11. The electronic device according to claim 9, wherein the light-emitting layer further comprises a non-fingerprint display region, and the non-fingerprint display region comprises a plurality of second visible light-emitting units.

12. The electronic device according to claim 11, wherein the display further comprises: a cathode layer and an anode layer, wherein:
   the light-emitting layer is disposed between the cathode layer and the anode layer.

13. The electronic device according to claim 12, wherein the display further comprises: an electron injection layer and an electron transport layer,
   wherein:
      the electron injection layer and the electron transport layer are disposed between the cathode layer and the light-emitting layer,
      the electron injection layer is superposed on the electron transport layer, the electron injection layer faces the cathode layer, and the electron transport layer faces the light-emitting layer.

14. The electronic device according to claim 12, wherein the display further comprises: a hole injection layer and a hole transport layer,
   wherein:
      the hole injection layer and the hole transport layer are disposed between the anode layer and the light-emitting layer,
      the hole injection layer is superposed on the hole transport layer, the hole injection layer faces the anode layer, and the hole transport layer faces the light-emitting layer.

\* \* \* \* \*